(12) United States Patent
Oikawa et al.

(10) Patent No.: US 9,369,084 B2
(45) Date of Patent: Jun. 14, 2016

(54) SOLAR CELL MODULE

(71) Applicant: Panasonic Intellectual Property Management Co., Ltd., Osaka (JP)

(72) Inventors: Yuki Oikawa, Kyoto (JP); Tatsuya Yoneda, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 14/887,729

(22) Filed: Oct. 20, 2015

(65) Prior Publication Data

US 2016/0043692 A1 Feb. 11, 2016

Related U.S. Application Data

(63) Continuation of application No. PCT/JP2014/061952, filed on Apr. 30, 2014.

(30) Foreign Application Priority Data

May 10, 2013 (JP) ................................. 2013-100243

(51) Int. Cl.
*H01L 31/044* (2014.01)
*H02S 30/10* (2014.01)
*H01L 31/048* (2014.01)
*H02S 40/36* (2014.01)

(52) U.S. Cl.
CPC .............. *H02S 30/10* (2014.12); *H01L 31/048* (2013.01); *H02S 40/36* (2014.12); *Y02E 10/50* (2013.01)

(58) Field of Classification Search
CPC ........ H01L 31/00–31/078; Y02E 10/50–10/60
USPC .................................................. 136/243–265
See application file for complete search history.

(56) References Cited

U.S. PATENT DOCUMENTS

| | | | |
|---|---|---|---|
| 6,799,398 B1* | 10/2004 | Plevyak | E04D 3/08 52/173.3 |
| 2011/0139225 A1* | 6/2011 | Boydell | H01L 31/048 136/251 |
| 2013/0160823 A1* | 6/2013 | Khouri | H01L 31/048 136/251 |
| 2014/0182650 A1* | 7/2014 | Lochun | H01L 31/02013 136/244 |

FOREIGN PATENT DOCUMENTS

| | | |
|---|---|---|
| JP | H05-5344 A | 1/1993 |
| JP | H10-306517 A | 11/1998 |
| JP | 2009-032806 A | 2/2009 |

* cited by examiner

*Primary Examiner* — Bach Dinh
(74) *Attorney, Agent, or Firm* — Mots Law, PLLC

(57) ABSTRACT

A transparent protective member includes first main surface and a second main surface, and having a curved surface shape. Solar cell panels are attached to the second main surface of the transparent protective member. An amount member attaches the solar cell panels to the second main surface. A connection member electrically connects the solar cell panels each other. The first main surface serves as a light-receiving surface. Each of the panels comprises a solar cell string including solar cells electrically connected to each other, a transparent first resin base member provided on one side of the solar cell string beside the transparent protective member, a second resin base member on the opposite side of the solar cell string from the first resin base member, and a filler layer provided between the first resin base member and the second resin base member and in which the solar cell string is encapsulated.

8 Claims, 8 Drawing Sheets

SOLAR CELL MODULE

CROSS REFERENCE TO RELATED APPLICATIONS

This application is a continuation application of International Application No. PCT/JP2014/061952, filed on Apr. 30, 2014, entitled "SOLAR CELL MODULE", which claims priority based on the Article 8 of Patent Cooperation Treaty from prior Japanese Patent Applications No. 2013-100243, filed on May 10, 2013, the entire contents of which are incorporated herein by reference.

BACKGROUND

The disclosure relates to a solar cell module.

Nowadays, solar cells are installed on houses and power generated by the solar cells are used in the homes or sold to power companies. Solar cells have been mainly installed on top of flat roofs heretofore. However, installing solar cells on places other than roofs are also being considered. Japanese Patent Application Publication No. H05-5344 (Patent Literature 1) describes a configuration in which a solar cell in the form of a flat panel is provided to a transparent glass roof material having a curved surface.

SUMMARY

An embodiment is a solar cell module comprising a transparent protective member including a first main surface and a second main surface, and being in a curved surface shape; solar cell panels attached to the second main surface of the transparent protective member; a mount member with which the solar cell panels are attached to the second main surface; and a connection member with which the solar cell panels are electrically connected to each other. The first main surface serves as a light-receiving surface. The solar cell panels each comprise a solar cell string including solar cells electrically connected to each other; a transparent first resin base member provided on one side of the solar cell string beside the transparent protective member; a second resin base member provided on the opposite side of the solar cell string from the first resin base member; and a filler layer which is provided between the first resin base member and the second resin base member and in which the solar cell string is encapsulated.

DETAILED DESCRIPTION

Figure 1:
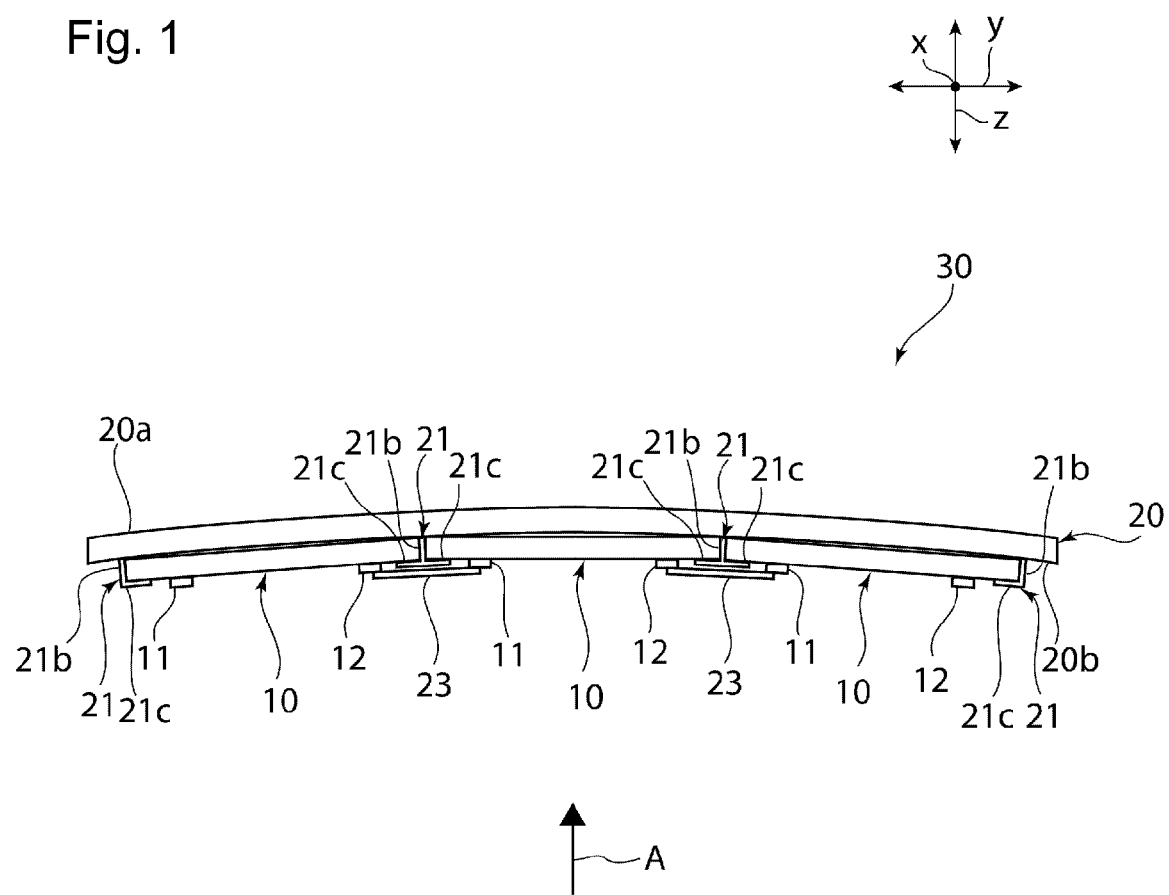
FIG. 1 is a side view illustrating a solar cell module of a first embodiment.

Embodiments are described below. It should be noted, however, that the following embodiments are merely illustrative examples, and the invention is not limited to the following embodiments. Moreover, in the drawings, members having virtually identical functions may be denoted by the same reference signs.

First Embodiment

Figure 2:
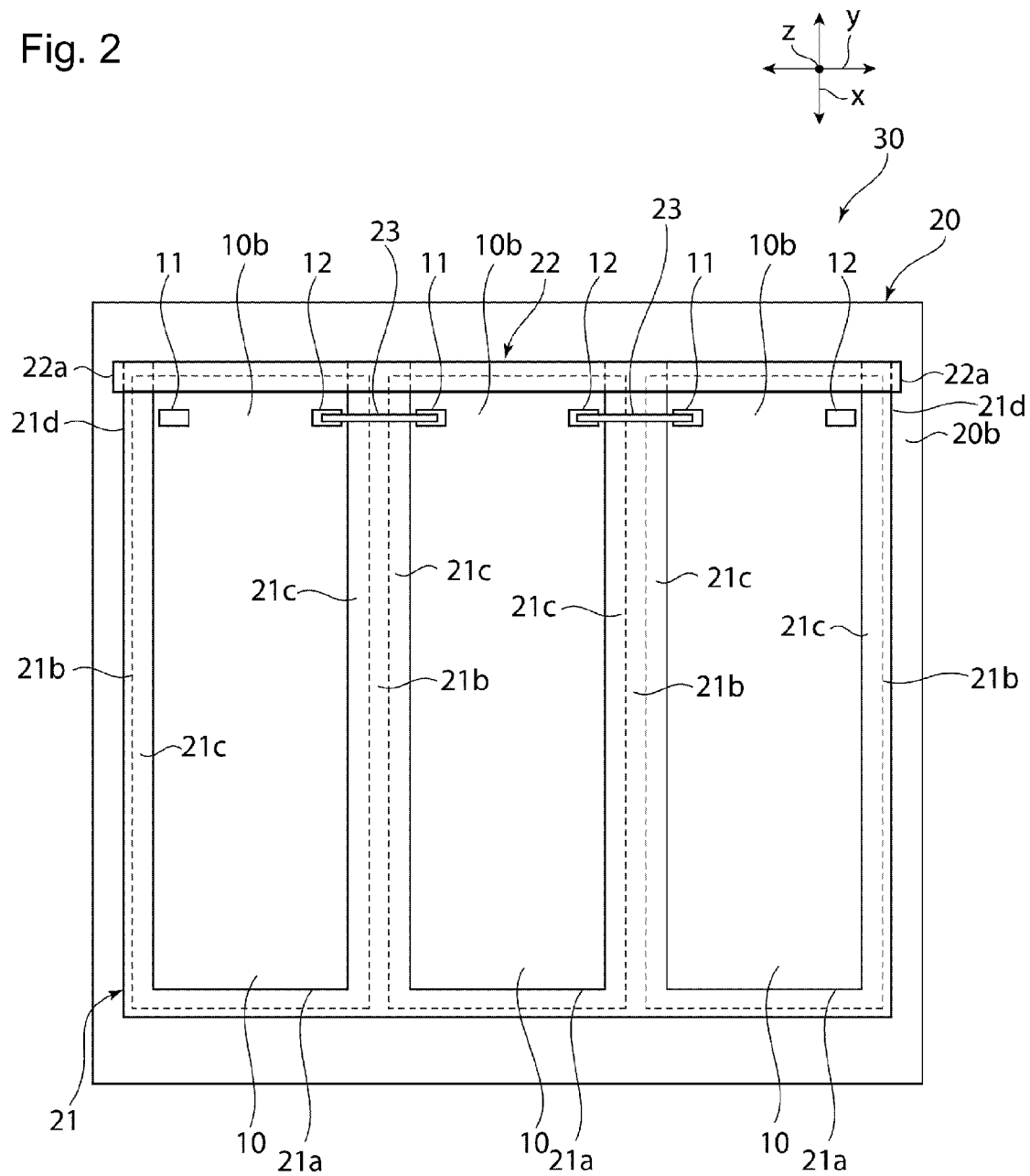
FIG. 2 is a rear view illustrating the solar cell module of the first embodiment illustrated in FIG. 1.

FIG. 1 is a side view illustrating a solar cell module of a first embodiment. FIG. 2 is a rear view illustrating the solar cell module of the first embodiment as viewed in the direction of arrow A illustrated in FIG. 1.

As illustrated in FIGS. 1 and 2, the solar cell module of this embodiment is configured by attaching three solar cell panels 10 to transparent protective member 20 with mount member 21 and joint member 22. It should be noted that joint member 22 is not illustrated in FIG. 1. Transparent protective member 20 has first main surface 20a and second main surface 20b. First main surface 20a and second main surface 20b are provided to face each other. Mount member 21 is provided on second main surface 20b. Accordingly, solar cell panels 10 are attached to second main surface 20b of transparent protective member 20.

As illustrated in FIG. 2, mount member 21 has three frame portions 21a, which are C-shaped in planar view. Solar cell panels 10 are housed in the frame portions 21a, respectively. Frame portion 21a includes perpendicular portion 21b extending in a direction (z direction) perpendicular to second main surface 20b and flange portion 21c extending in a direction (y or x direction) parallel to second main surface 20b. Accordingly, frame portion 21a has a L-shaped or T-shaped cross section.

Solar cell panels 10 are inserted into and housed in frame portion 21a as illustrated in FIG. 1, and joint member 22 is then attached to end portion 21d of frame portion 21a as illustrated in FIG. 2. In this embodiment, two opposite end portions 22a of joint member 22 are mechanically joined to end portion 21d of frame portion 21a by snap-fit or the like to be attached thereto. However, the invention is not limited to such a joint technique. For example, threaded holes or the like may be formed in end portion 21d of frame portion 21a and two opposite end portions 22a of joint member 22 to join these together with screws or the like. Moreover, one end portion of joint member 22 may be formed to be continuous with frame portion 21a, with only other end portion thereof being provided to be joined to frame portion 21a. The other end portion of the joint member 22 may be fixed to frame portion 21a.

As illustrated in FIGS. 1 and 2, each solar cell panel 10 has first output wiring member 11 and second output wiring member 12 provided thereon. First output wiring member 11 of one solar cell panel 10 of two adjacent solar cell panels 10 and second output wiring member 12 of other solar cell panel thereof are electrically connected to each other with connection member 23. Accordingly, power generated in three solar cell panels 10 can be extracted through first output wiring member 11 of solar cell panel 10 located at one end and second output wiring member 12 of solar cell panel 10 located at other end.

Transparent protective member 20 can be formed of, for example, resin, glass, or the like. From the viewpoint of reducing the weight of solar cell module 30, transparent protective member 20 is preferably formed of resin. The resin may be polycarbonate resin, acrylic resin, polypropylene resin, or the like. Mount member 21 and joint member 22 can be formed of, for example, resin or the like. Mount member 21 may be attached to second main surface 20b of transparent protective member 20 with adhesive or by fusion welding or the like, or may be formed of the same resin as that of transparent protective member 20 integrally with transparent protective member 20. Resin for forming mount member 21 and joint member 22 may be thermosetting resin such as phenolic resin or unsaturated polyester resin.

Transparent protective member 20 has a curved surface shape as illustrated in FIG. 1. By arranging solar cell panels 10 along the curved surface, solar cell module 30 can be formed in a curved surface shape.

Figure 3:
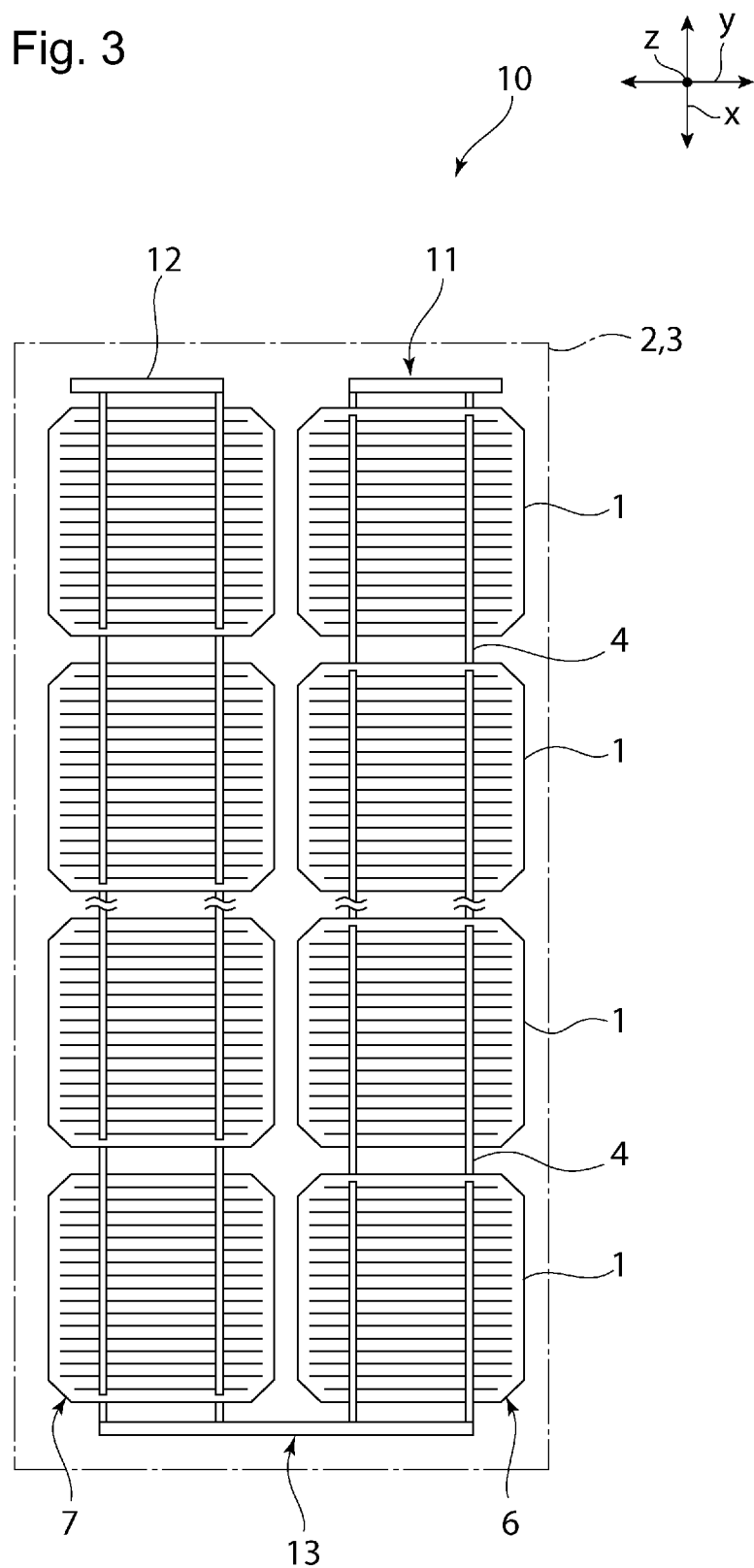
FIG. 3 is a schematic front view illustrating solar cell strings in a solar cell panel of the first embodiment.

FIG. 3 is a schematic front view illustrating solar cell strings in the solar cell panel of the first embodiment. As illustrated in FIG. 3, solar cell panel 10 has solar cell strings 6 and 7 provided therein. Solar cell strings 6 and 7 are configured by electrically connecting solar cells 1 to each other with wiring members 4. One end of solar cell string 6 has first output wiring member 11 connected thereto. One end of solar cell string 7 has second output wiring member 12 connected thereto. Other end of solar cell string 6 and other end of solar cell string 7 are electrically connected to each other with interconnection wiring member 13.

Figure 4:
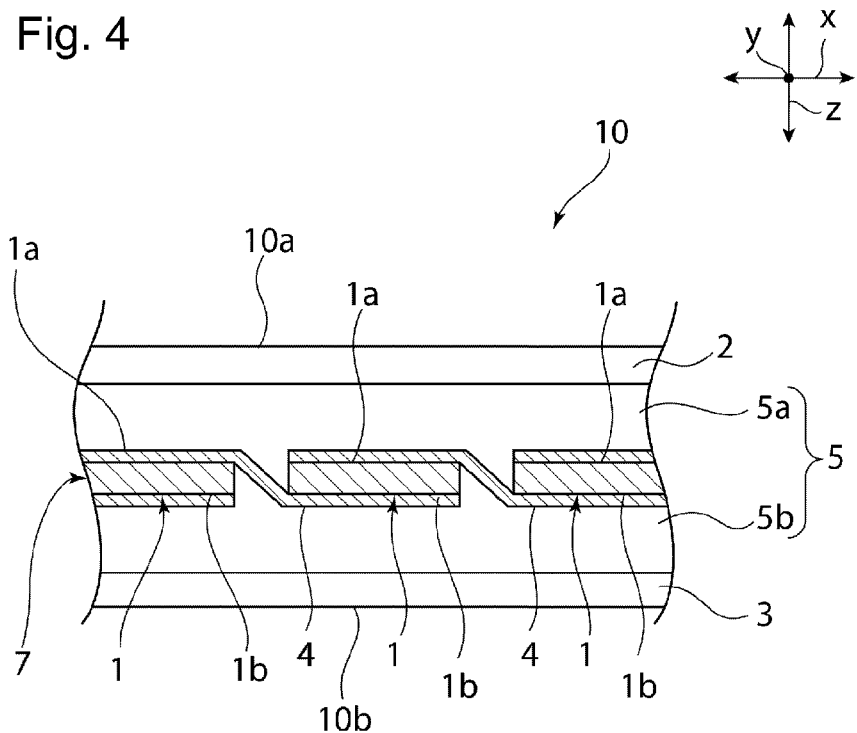
FIG. 4 is a schematic cross-sectional view illustrating the solar cell panel.

FIG. 4 is a schematic cross-sectional view illustrating solar cell panel 10. FIG. 4 is a schematic cross-sectional view of solar cell string 7 taken along wiring member 4. As illustrated in FIG. 4, each wiring member 4 is provided to electrically connect an electrode on back surface 1b of one solar cell 1 of two adjacent solar cells 1 and an electrode on front surface 1a of other solar cell 1 thereof.

On the same side as front surfaces 1a of solar cells 1, first resin base member 2 that is transparent is provided. In this embodiment, front surfaces 1a of solar cells 1 serves as light-receiving surfaces. Accordingly, first resin base member 2 that is transparent is provided on the same side as transparent protective member 20. On the same side as back surface 1b of solar cells 1, second resin base member 3 is provided. First resin base member 2 and second resin base member 3 can be formed of resin such as polyethylene terephthalate (PET). First resin base member 2 and second resin base member 3 preferably have thicknesses, which allow the resin base members to have flexibility.

Filler layer 5 for encapsulating solar cells 1 is provided between first resin base member 2 and second resin base member 3. Filler layer 5 can be formed of crosslinkable resin such as ethylene-vinyl acetate copolymer (EVA) or non-crosslinkable olefin resin. Filler layer 5 includes filler layer 5a on the same side as first resin base member 2, and filler layer 5b on the same side as second resin base member 3. Filler layer 5b may contain a reflective material for reflecting light entering from the same side as first resin base member 2. For example, filler layer 5b may contain white pigment such as titanium oxide as reflective material. Second resin base member 3 may also contain reflective material.

Solar cell panels 10 configured as described above are attached to the second main surface 20b side of transparent protective member 20 with mount member 21 and joint member 22 as illustrated in FIG. 2. First output wiring member 11 and second output wiring member 12 illustrated in FIG. 3 are drawn to be exposed on back surface 10b of solar cell panel 10 as illustrated in FIG. 2. As described previously, first output wiring member 11 of one of two adjacent solar cell panels 10 and second output wiring member 12 of other thereof are electrically connected to each other with connection member 23, and first output wiring member 11 of solar cell panel 10 located at one end and second output wiring member 12 of solar cell panel 10 located at other end serve as terminals from which power is extracted. Light entering from first main surface 20a of transparent protective member 20 enter light-receiving surfaces 10a of solar cell panels 10, and power generated in solar cell panels 10 is extracted through the above-described terminals.

Solar cell module 30 of this embodiment is configured by attaching solar cell panels 10 to transparent protective member 20 having a curved surface shape. Accordingly, solar cell module 30 having a curved surface shape can be obtained. Moreover, since solar cell panel 10 is formed using first resin base member 2 and second resin base member 3, solar cell module 30 can be reduced in weight.

Second Embodiment

Figure 5:
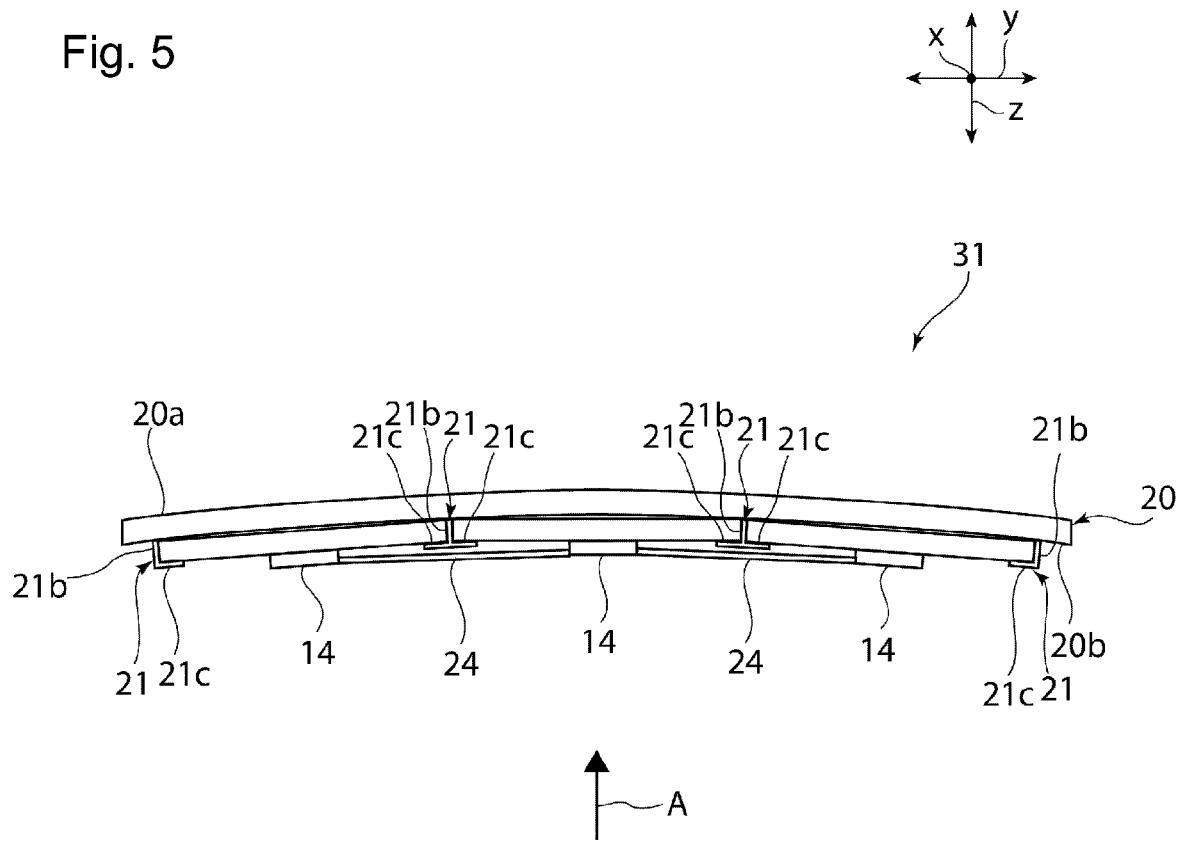
FIG. 5 is a side view illustrating a solar cell module of a second embodiment.
Figure 6:
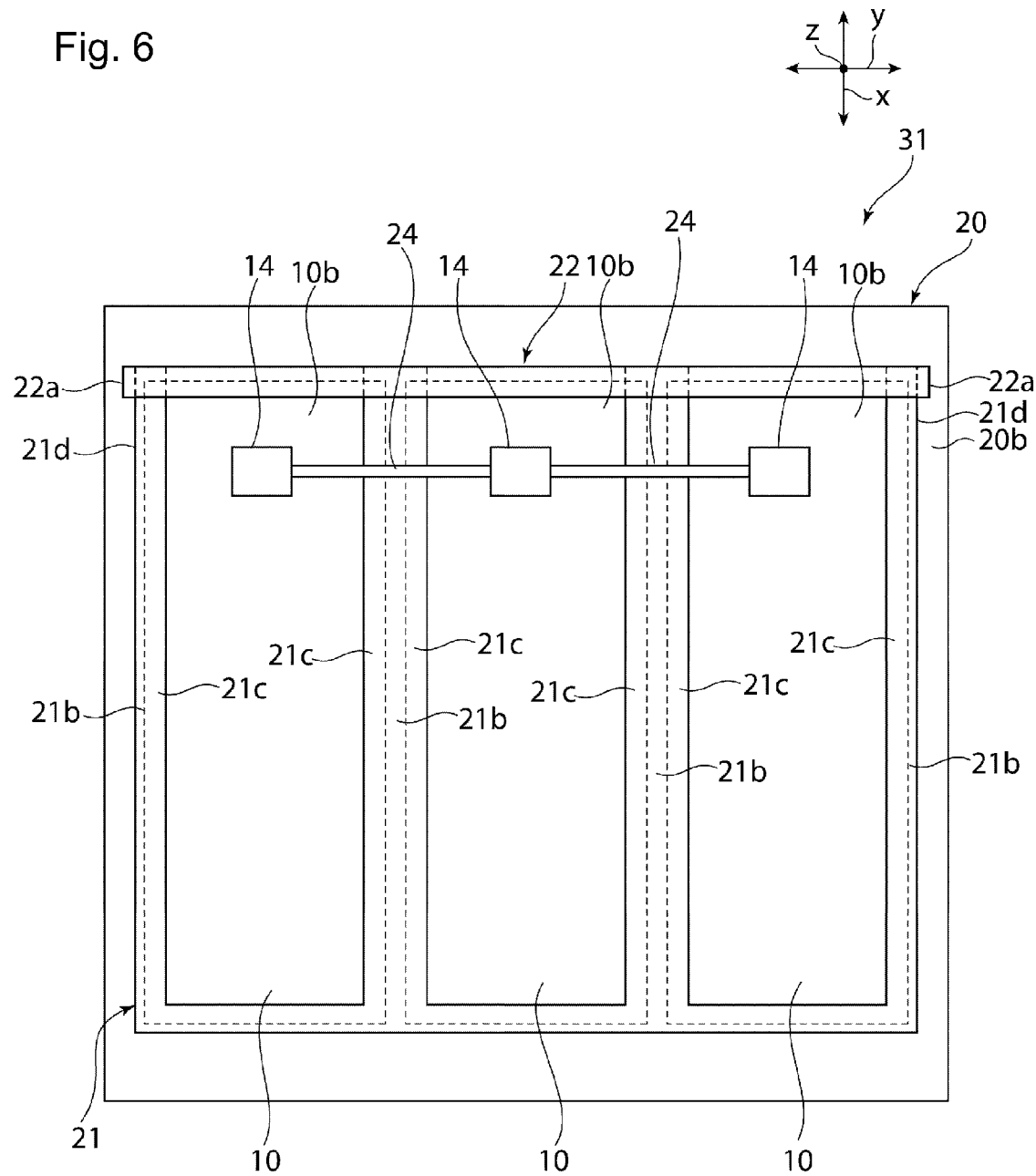
FIG. 6 is a rear view illustrating the solar cell module of the second embodiment illustrated in FIG. 5.

FIG. 5 is a side view illustrating solar cell module 31 of a second embodiment. FIG. 6 is a rear view illustrating the solar cell module 31 of the second embodiment as viewed in the direction of arrow A illustrated in FIG. 5. In this embodiment, as illustrated in FIGS. 5 and 6, terminal box 14 is provided on back surface 10b of each solar cell panel 10, and terminal boxes 14 are connected to each other with connection members 24.

Figure 7:
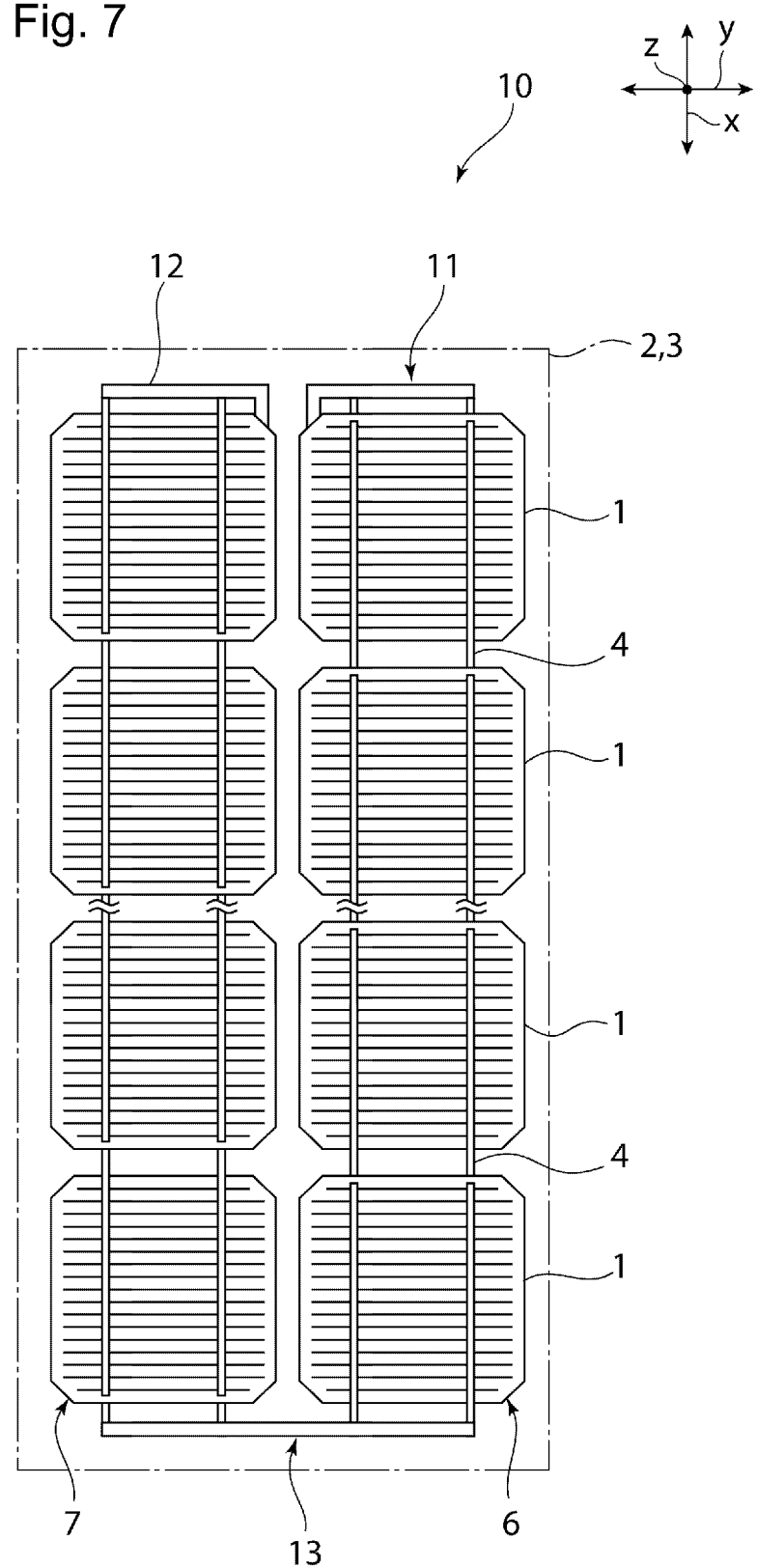
FIG. 7 is a schematic front view illustrating solar cell strings in the solar cell panel of the second embodiment.

FIG. 7 is a schematic front view illustrating solar cell strings in solar cell panel 10 of the second embodiment. As illustrated in FIG. 7, as in the first embodiment, solar cell strings 6 and 7 are provided in solar cell panel 10, and solar cell strings 6 and 7 are electrically connected to each other with interconnection wiring member 13. First output wiring member 11 connected to one end of solar cell string 6 and second output wiring member 12 connected to one end of solar cell string 7 are drawn to terminal box 14 illustrated in FIG. 6 to be electrically connected to terminals in terminal box 14.

Power generated by solar cells 1 in solar cell panels 10 can be extracted through terminals in terminal boxes 14 of solar cell panels 10 at two opposite ends illustrated in FIG. 6.

In this embodiment, as in the first embodiment, solar cell module 30 having a curved surface shape can be obtained, and the weight thereof can be reduced.

Third Embodiment

Figure 8:
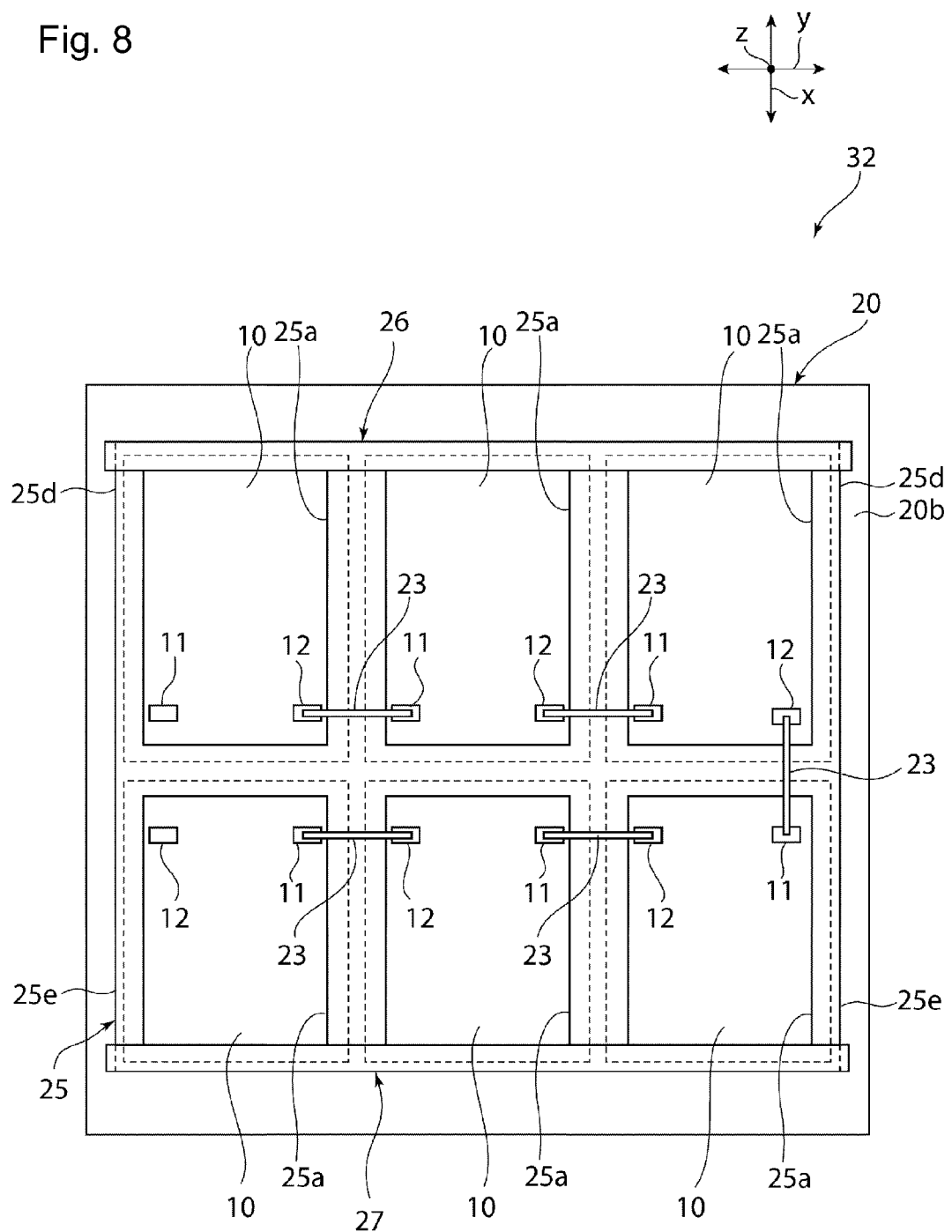
FIG. 8 is a rear view illustrating a solar cell module of a third embodiment.

FIG. 8 is a rear view illustrating solar cell module 32 of a third embodiment. In this embodiment, as illustrated in FIG. 8, three solar cell panels 10 are arranged in the y direction, and two solar cell panels 10 are arranged in the x direction. Thus, a total of six solar cell panels 10 are used. By also arranging a plurality of solar cell panels 10 in the x direction, transparent protective member 20 having a curved surface shape also curved in the x direction can be used. Mount member 25 is attached to second main surface 20b of transparent protective member 20 in a manner similar to that of the first embodiment. Mount member 25 has frame portions 25a formed therein: three in the y direction, and two in the x direction. After solar cell panels 10 are inserted into frame portions 25a, respectively, joint member 26 is joined to one end portion 25d of frame portion 25a, and joint member 27 is joined to other end portion 25e thereof. Thus, solar cell panels 10 are attached to transparent protective member 20.

As illustrated in FIG. 8, in this embodiment, first output wiring members 11 and second output wiring members 12 of solar cell panels 10 are arranged to be close to each other between solar cell panels 10. Thus, first output wiring member 11 and second output wiring member 12 located on the left side of FIG. 8 to serve as output terminals of solar cell module 32 can be located close to each other, and wiring between two adjacent solar cell panels 10 can be easily performed. As in the first embodiment, first output wiring member 11 and second output wiring member 12 are electrically connected to each other with connection member 23 between two adjacent solar cell panels 10.

In this embodiment, as in the first embodiment, solar cell module 30 having a curved surface shape can be obtained, and the weight thereof can be reduced. This embodiment is particularly suitable for the case where the curved surface shape of transparent protective member 20 greatly changes. In the case where the curved surface shape of transparent protective member 20 is monotonous and gradually changes, solar cell module 30 of the first embodiment can be used. However, in the case where the curved surface shape of transparent protective member 20 includes a steeply changing portion, solar cell panel 10 is subjected to stress and may be broken. By using this embodiment, stress imposed on each solar cell panel 10 can be reduced, and the reliability of solar cell module 32 can be improved.

Fourth Embodiment

Figure 9:
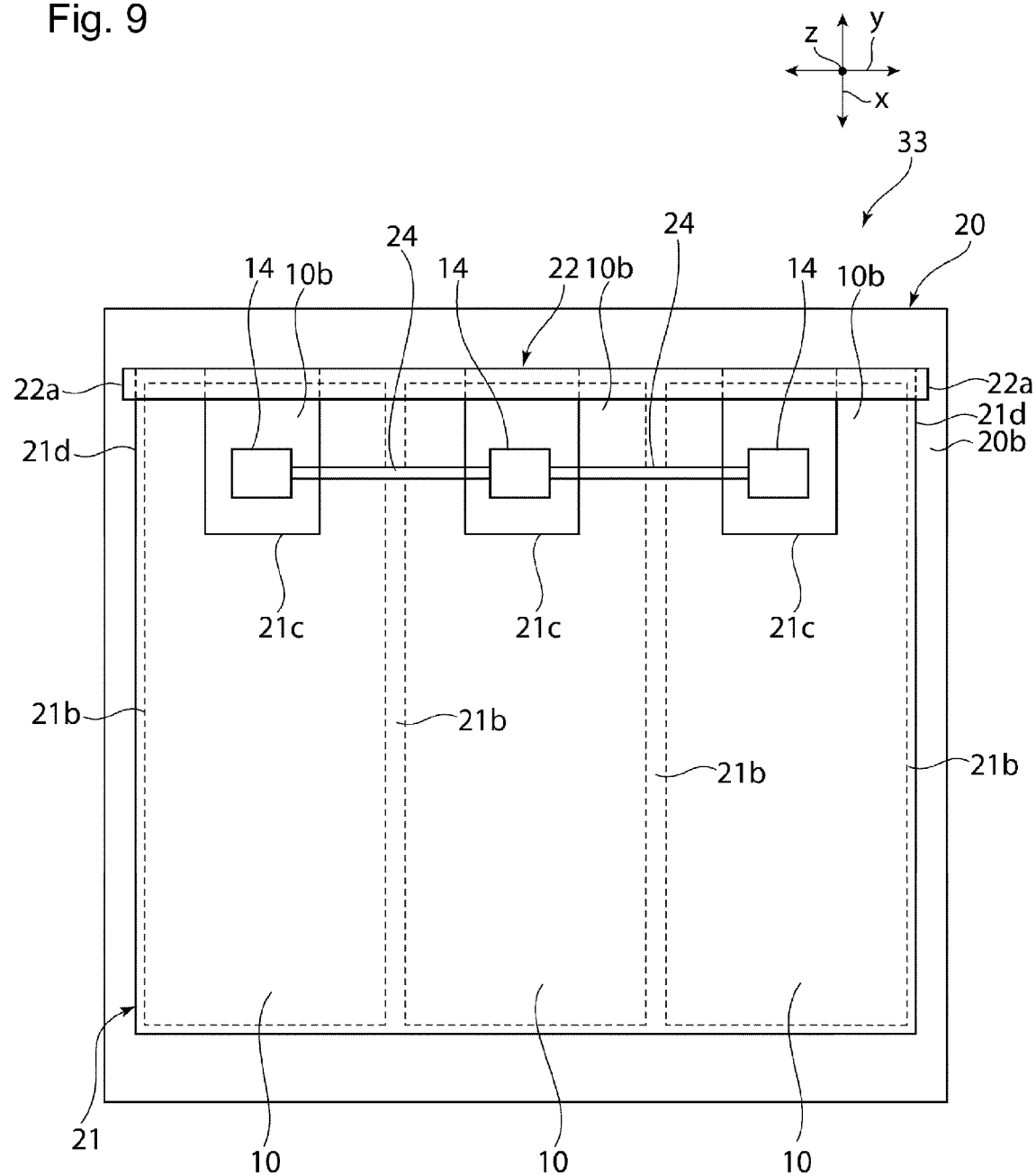
FIG. 9 is a rear view illustrating a solar cell module of a fourth embodiment.

FIG. 9 is a rear view illustrating solar cell module 33 of a fourth embodiment. This embodiment is the same as the second embodiment except for the shape of flange portion 21c. Flange portion 21c of this embodiment is configured to have a larger area than that of the second embodiment. Specifically, flange portion 21c is configured to cover solar cell panel 10 in a region in which terminal box 14 is not provided.

In this embodiment, a solar cell module having a curved surface shape can be obtained, and the ability of mount member 21 to hold solar cell panels 10 can be improved.

It should be noted that in the first to fourth embodiments, the curved surface shape of transparent protective member 20 is not limited to the curved surface shapes of the above-described embodiments, and various curved surface shapes can be employed. Moreover, the positions, number, and the like of solar cell panels 10 to be arranged can be appropriately adjusted in accordance with the curved surface shape of the solar cell module, i.e., the curved surface shape of the transparent protective member.

In the case where solar cells are mounted on a curved surface, a solar cell module following the shape of the curved surface is desired. Meanwhile, a solar cell module having a reduced weight is desired.

The embodiments above provide solar cell modules, which can be formed in any of various curved surface shapes and can be reduced in weight.

According to the embodiments above, it is possible to form a solar cell module in any of various curved surface shapes while reducing the weight of the solar cell module.

The invention includes other embodiments in addition to the above-described embodiments without departing from the spirit of the invention. The embodiments are to be considered in all respects as illustrative, and not restrictive. The scope of the invention is indicated by the appended claims rather than by the foregoing description. Hence, all configurations including the meaning and range within equivalent arrangements of the claims are intended to be embraced in the invention.

The invention claimed is:

1. A solar cell module comprising:
   a transparent protective member including a first main surface and a second main surface, and having a curved surface shape, wherein the first main surface is provided on a light-receiving side;
   a plurality of solar cell panels, each of which having a first principal surface attached to the second main surface of the transparent protective member and a second principal surface provided on an opposite side of the first principal surface;
   a mount member with which the solar cell panels are attached to the second main surface; and
   a connection member with which the solar cell panels are electrically connected to each other,
   wherein
   each of the solar cell panels comprises:
      a solar cell string including solar cells electrically connected to each other;
      a transparent first resin base member provided on one side of the solar cell string and adjacent to the transparent protective member;
      a second resin base member provided on the opposite side of the solar cell string from the first resin base member; and
      a filler layer that is provided between the first resin base member and the second resin base member and in which the solar cell string is encapsulated,
   the mount member includes a frame portion that covers an outside edge of each of the solar cell panels and a part of the second principle surface at an end portion of each of the solar cell panels,
   the solar cell panels inserted in the frame portion are mounted on the second main surface of the transparent protective member together with the frame portion, and
   in a cross section view of the solar cell module, the transparent protective member extends more outside than the frame portion that covers the end faces of the solar cell panels.

2. The solar cell module according to claim 1, wherein the transparent protective member is formed of resin.

3. The solar cell module according to claim 1, wherein
   each of the solar cell panels comprises an output wiring member connected to an electrode at an end portion of the solar cell string, and
   the connection member connects the output wiring members of the solar cell panels to each other.

4. The solar cell module according to claim 1, wherein each of the solar cell panels comprises two or more of the solar cell strings.

5. The solar cell module according to claim 4, wherein the solar cell strings are electrically connected to each other with an interconnection wiring member.

6. The solar cell module according to claim 1, wherein the first resin base member and the second resin base member have thicknesses that allow the resin base members to have flexibility.

7. The solar cell module according to claim 1, wherein the first resin base member and second resin base member are formed of polyethylene terephthalate (PET).

8. The solar cell module according to claim 1, wherein the plurality of solar cell panels are arranged along the curved surface.

* * * * *